US006369691B1

(12) United States Patent
Chiu

(10) Patent No.: US 6,369,691 B1
(45) Date of Patent: Apr. 9, 2002

(54) SWITCH TYPE VARIABLE RESISTOR

(75) Inventor: Hsien-Ta Chiu, Tao Yuan Hsien (TW)

(73) Assignee: Hung Ta Enterprise Co., Ltd., Tao Yuan Hsien (TW)

( * ) Notice: Subject to any disclaimer, the term of this patent is extended or adjusted under 35 U.S.C. 154(b) by 0 days.

(21) Appl. No.: 09/900,999

(22) Filed: Jul. 9, 2001

(51) Int. Cl.[7] .......... H01L 10/36

(52) U.S. Cl. .......... 338/172; 338/200; 338/132; 338/135

(58) Field of Search .......... 338/172, 191, 338/200, 130, 132, 135

(56) References Cited

U.S. PATENT DOCUMENTS 2,230,187 A * 1/1941 Meuer et al. .......... 338/172
2,958,838 A * 11/1960 Puerner .......... 338/132
3,913,059 A * 10/1975 Matsui et al. .......... 338/132
4,228,846 A * 10/1980 Smorol .......... 338/200
4,297,671 A * 10/1981 Flanders .......... 338/200
4,523,175 A * 6/1985 Sakurai .......... 33/132

* cited by examiner

*Primary Examiner*—Karl D. Easthom
(74) *Attorney, Agent, or Firm*—Alan Kamrath; Rider, Bennett, Egan & Arundel, LLP

(57) ABSTRACT

The present invention relates to a switch type variable resistor, including a rotation shaft, a bushing, a housing, a variable resistor portion, and a switch portion. The switch portion includes a switch portion seat, a control plate, an insulating plate, a pair of electrode terminals, an elastic connecting member, an annular connecting member, a rotary member, and a rivet. The variable resistor portion includes a pair of terminal seats each having variable resistor carbon film plates and terminals, a pair of contact plates, and a contact plate seat. The contact plates and the control plate are rotated by the rotation shaft, thereby forming the complete switch type variable resistor.

2 Claims, 4 Drawing Sheets

SWITCH TYPE VARIABLE RESISTOR

BACKGROUND OF THE INVENTION

1. Field of the Invention

The present invention relates to a switch type variable resistor, and more particularly to a dual connection switch type variable resistor.

2. Description of the Related Art

A conventional switch type variable resistor in accordance with the prior art comprises a control plate pivoted to the switch knob, an insulation fixing plate secured on the switch housing, a first terminal secured on one side of the insulation fixing plate, a second terminal secured on the other side of the insulation fixing plate, a conducting plate pivoted on the insulation fixing plate, and a positioning spring for positioning the conducting plate having a first end secured on the conducting plate and a second end secured on the insulation fixing plate. The positioning spring is used for positioning the conducting plate, so that the conducting plate is located at the opened or closed position. Thus, the number of the parts is increased, and the assembly work is more complicated and difficult, so that the switching action is not exact. In addition, if the mutual deflection of the resistors produces after assembly, it is necessary to dismantle the parts for adjustment, thereby causing inconvenience in use.

SUMMARY OF THE INVENTION

The primary objective of the present invention is to provide a switch type variable resistor comprising a rotation shaft, a bushing, a housing, a variable resistor portion, and a switch portion, wherein the switch portion includes:

a control plate, having a bottom edge formed with a lug;

a pair of electrode terminals, each having a tail end bent with a contact portion, one electrode terminal having an upper end pivoted with a rotary member and an annular connecting member by a rivet;

a rotary member, having a through hole for passage of the rivet, and formed with an insertion hole for insertion of the elastic connecting member;

an annular connecting member, made of a conducting metal, and having a through hole for passage of the rivet, the annular connecting member formed with a ring portion defining a penetration hole for passage of the rotation shaft, the penetration hole formed with a locking portion for locking the elastic connecting member, so that the annular connecting member may be rotated by the elastic connecting member, the ring portion provided with two contact guide portions corresponding to the positions of the contact portions of the two electrodes terminals;

an elastic connecting member having a first end inserted into the insertion hole of the rotary member, and a second end locked in the locking portion of the annular connecting member;

an insulating plate having a periphery formed with combination recesses, and a center defining a hole, the insulating plate having a front end riveted with the two electrode terminals, and a rear end defining a slide slot for limiting displacement of the elastic connecting member that protrudes from the locking portion of the annular connecting member;

a switch portion seat having a periphery formed with multiple combination pins, a center formed with a receiving hole, and having a front side formed with an opening for receiving each part of the switch portion;

wherein, the control plate is rotated by the rotation shaft, and the lug of the control plate is rested on the rotary member, so that the rotary member is rotated about the rivet, while the annular connecting member is rotated when the rotary member is rotated, so that the two contact guide portions of the annular connecting member is rotated to contact and conduct one of the two contact portions of the electrodes terminals on the insulating plate 53, thereby forming an opened or closed status.

Another objective of the present invention is to provide a switch type variable resistor, wherein the variable resistor portion disposed in a dual connection includes a pair of terminal seats each having variable resistor carbon film plates and terminals, a pair of contact plates, and a contact plate seat, each contact plate is rotated by the rotation shaft to contact the variable resistor carbon film plates of the terminal seat at different locations, thereby changing the resistance values, the contact plate seat consists of an upper seat and a lower seat, the upper seat has a periphery formed with adjusting teeth, while the housing is formed with adjusting windows corresponding to the positions of the adjusting teeth, thereby adjusting mutual deflection of the contact plates of the upper and lower seats and the variable resistor carbon film plates.

A further objective of the present invention is to provide a switch type variable resistor which has a shortened bulk.

A further objective of the present invention is to provide a switch type variable resistor whose switching action is exact and stable.

A further objective of the present invention is to provide a switch type variable resistor which has a long lifetime.

A further objective of the present invention is to provide a switch type variable resistor whose electrical contact is stable.

A further objective of the present invention is to provide a switch type variable resistor which can adjust the mutual deflection of resistors.

Further benefits and advantages of the present invention will become apparent after a careful reading of the detailed description with appropriate reference to the accompanying drawings.

DETAILED DESCRIPTION OF THE INVENTION

Figure 1:
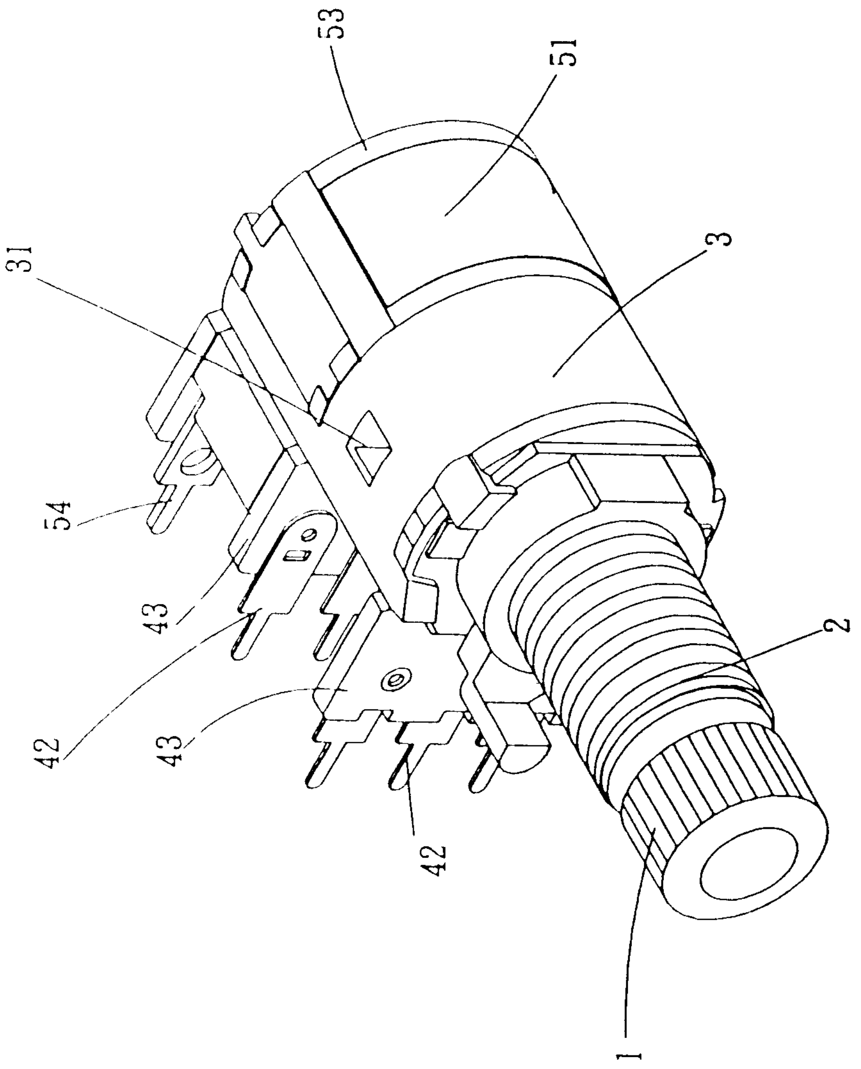
FIG. 1 is a perspective view of a switch type variable resistor in accordance with the present invention.
Figure 2:
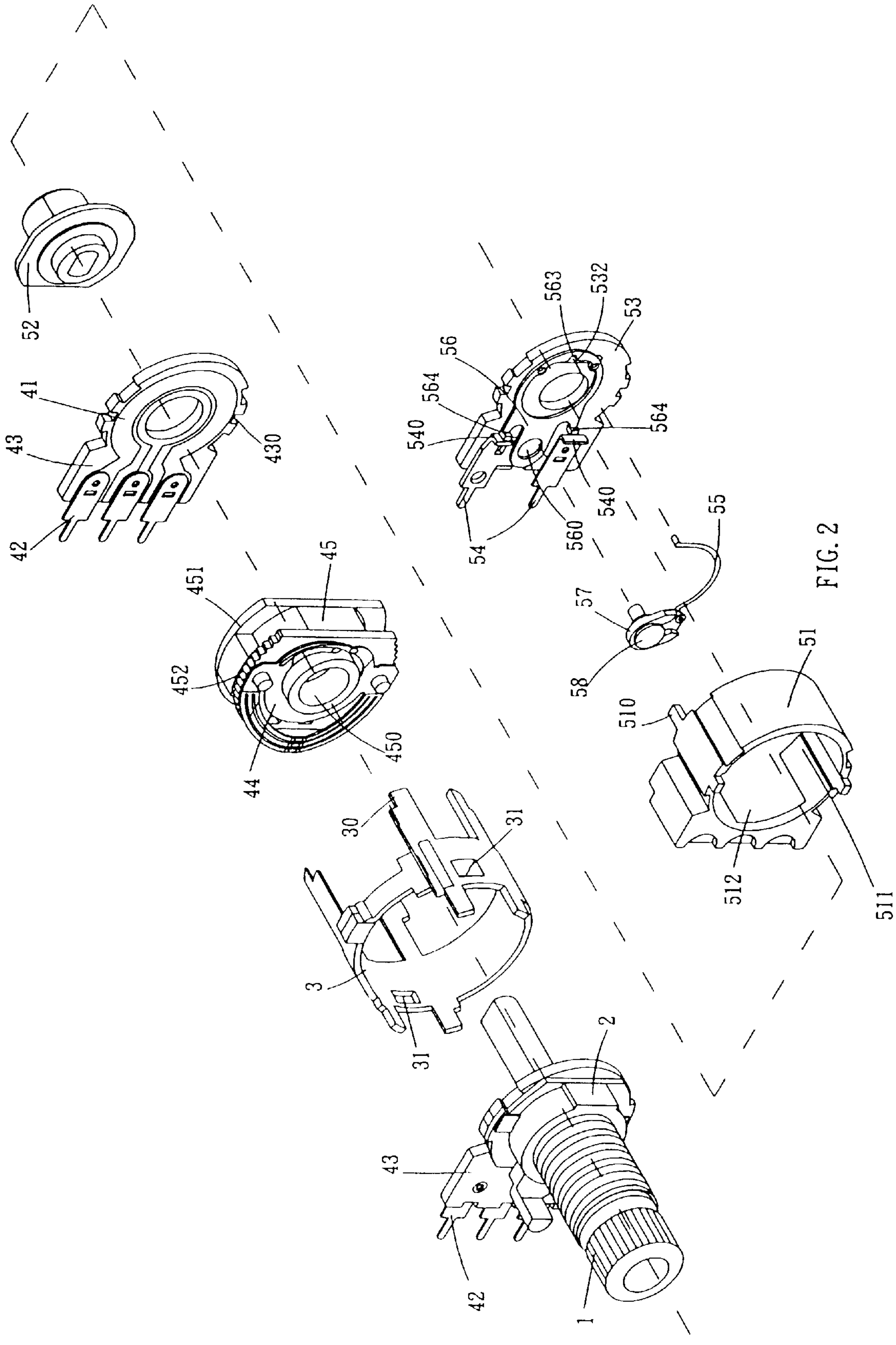
FIG. 2 is a partially exploded perspective view of the switch type variable resistor as shown in FIG. 1.
Figure 3:
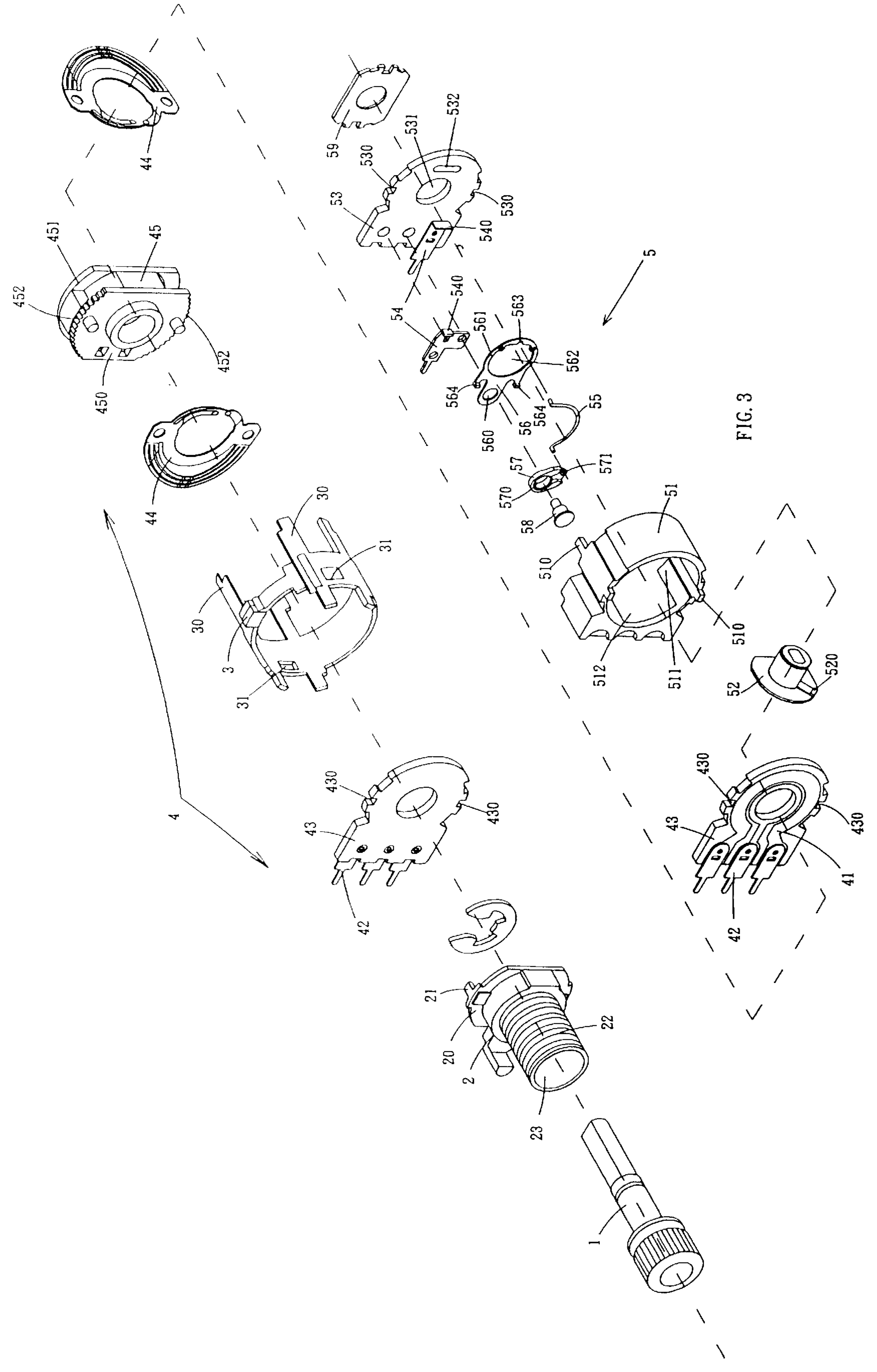
FIG. 3 is a complete exploded perspective view of the switch type variable resistor as shown in FIG. 1.
Figure 4:
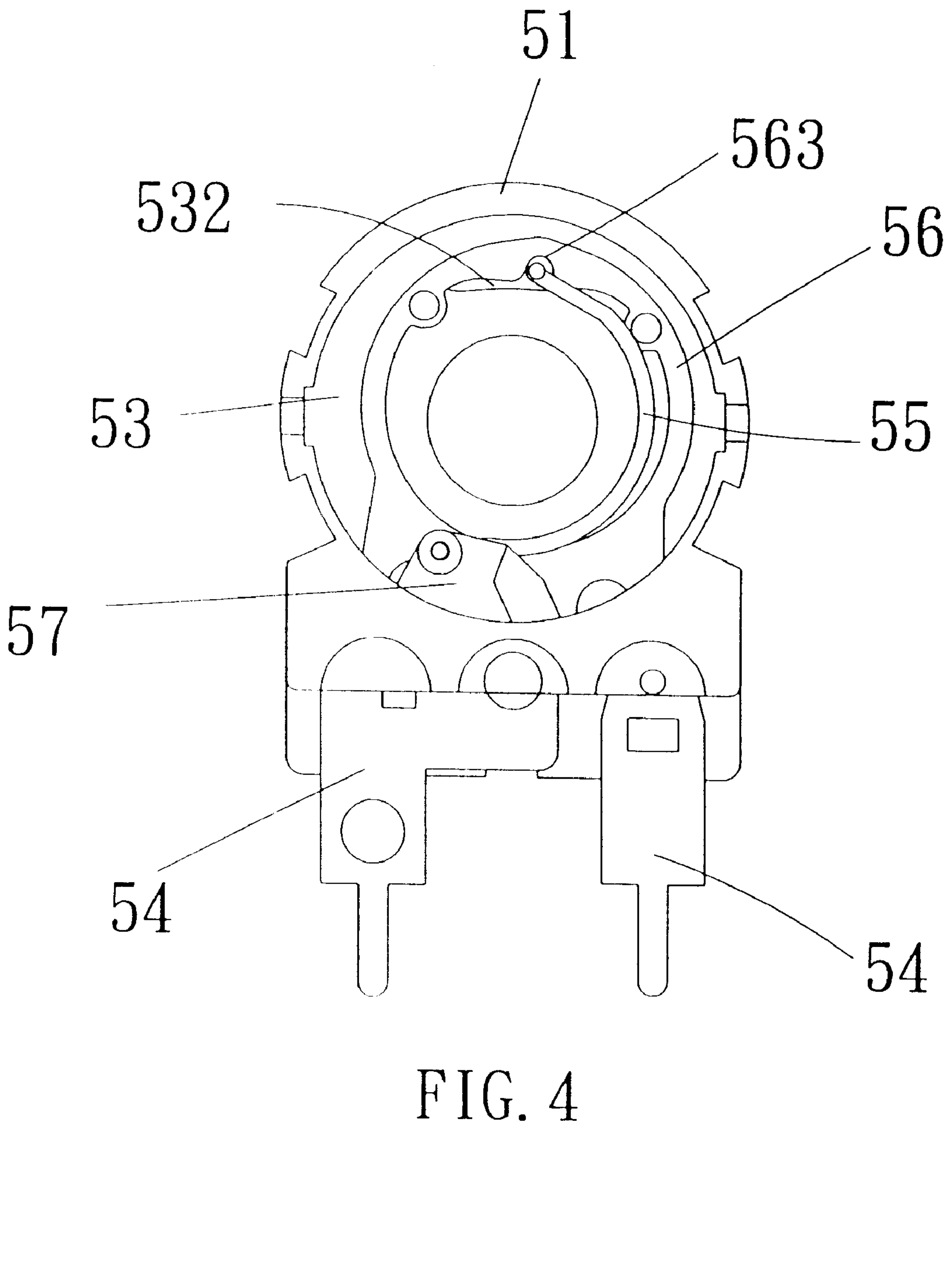
FIG. 4 is a top plan view of the switch type variable resistor as shown in FIG. 1.

Referring to the drawings, a switch type variable resistor in accordance with the present invention comprises a rotation shaft 1, a bushing 2, a housing 3, a variable resistor portion 4, and a switch portion 5.

The switch portion 5 includes a switch portion seat 51, a control plate 52, an insulating plate 53, a pair of electrode terminals 54, an elastic connecting member 55, an annular connecting member 56, a rotary member 57, and a rivet 58.

The variable resistor portion 4 includes a pair of terminal seats 43 each having variable resistor carbon film plates 41 and terminals 42, a pair of contact plates 44, and a contact plate seat 45. Rotation of the rotation shaft 1 may rotate the contact plates 44 and the control plate 52, thereby forming the complete switch type variable resistor. The rotation shaft 1 is used to pivot the contact plate seat 45 and the control plate 52, thereby changing the resistance and the switch resistor.

The bottom of the bushing 2 is formed with a seat 20 whose bottom has combination pins 21. The bushing 2 is formed with a threaded column 22, and defines a hole 23.

The housing 3 is formed with a plurality of extended bendable snap portions 30 for combining each part into an integrity. In the dual connection type design, the periphery of the housing 3 is formed with adjusting windows 31.

In the dual connection type design, the variable resistor portion 4 includes a pair of terminal seats 43 each having variable resistor carbon film plates 41 and terminals 42, a pair of contact plates 44, and a contact plate seat 45. The periphery of each terminal seat 43 is provided with combination recesses 430, thereby facilitating secure combination of the combination pins 21 of the seat 20, the combination pins 510 of the switch portion seat 51, and the snap portions 30 of the housing 3. The contact plates 44 are fixed on the combination face of the contact plate seat 45. Each contact plate 44 is rotated by the rotation shaft 1 to contact the variable resistor carbon film plates 41 of the terminal seat 43 at different locations, thereby changing the resistance values.

The characteristic of the present invention is described as follows.

The contact plate seat 45 consists of an upper seat 450 and a lower seat 451. The periphery of the upper seat 450 is formed with adjusting teeth 452, while the housing 3 is formed with adjusting windows 31 corresponding to the positions of the adjusting teeth 452, thereby adjusting mutual deflection of the contact plates 44 of the upper and lower seats 450 and 451 and the variable resistor carbon film plates 41, without having to dismantle the parts for adjustment as is disclosed in the prior art which is not provided with any adjusting mechanism.

The bottom of the control plate has a lug 520. The insulating plate 53 is provided with two electrode terminals 54 each having a tail end bent with a contact portion 540. One electrode terminal 54 has an upper end pivoted with the rotary member 57 and the annular connecting member 56 by a rivet 58. The rotary member 57 has a through hole 570 for passage of the rivet 58. The through hole 570 is formed with an insertion hole 571 for insertion of the elastic connecting member 55.

The annular connecting member 56 is made of a conducting metal, and has a through hole 560 for passage of the rivet 58. The annular connecting member 56 is formed with a ring portion 561 defining a penetration hole 562 for passage of the rotation shaft 1. The penetration hole 562 is formed with a locking portion 563 for locking the elastic connecting member 55, so that the annular connecting member 56 may be rotated by the elastic connecting member 55. The ring portion 561 is provided with two contact guide portions 564 corresponding to the positions of the contact portions 540 of the two electrodes terminals 54, so that the contact guide portions 564 may be rotated to respectively contact and conduct one of the two contact portions 540 of the two electrodes terminals 54, thereby forming the opened or closed status.

The elastic connecting member 55 has a first end inserted into the insertion hole 571 of the rotary member 57, and a second end locked in the locking portion 563 of the annular connecting member 56. The insulating plate 53 has a periphery formed with combination recesses 530, and a center defining a hole 531. The insulating plate 53 has a front end riveted with the two electrode terminals 54, and a rear end defining a slide slot 532 for limiting displacement of the elastic connecting member 55 that protrudes from the locking portion 563 of the annular connecting member 56.

The switch portion seat 51 has a periphery formed with combination pins 510, a center formed with a receiving hole 511, and has a front side formed with an opening 512 for receiving each part of the switch portion 5.

The control plate 52 is rotated by the rotation shaft 1. The lug 520 of the control plate 52 is rested on the rotary member 57, so that the rotary member 57 may be rotated about the rivet 58. The two ends of the elastic connecting member 55 are respectively inserted into the rotary member 57 and the annular connecting member 56. Thus, the annular connecting member 56 is rotated when the rotary member 57 is rotated, so that the two contact guide portions 564 of the annular connecting member 56 may be rotated to contact and conduct one of the two contact portions 540 of the electrodes terminals 54 on the insulating plate 53. Thus, the present invention may form a proper opened or closed status, so that the electrical conduct is stable, and the switch action is exact.

Although the invention has been explained in relation to its preferred embodiment as mentioned above, it is to be understood that many other possible modifications and variations can be made without departing from the scope of the present invention. It is, therefore, contemplated that the appended claim or claims will cover such modifications and variations that fall within the true scope of the invention.

What is claimed is:

1. A switch type variable resistor, comprising:

a rotation shaft, a bushing, a housing, a variable resistor portion, and a switch portion, wherein the switch portion includes:

a control plate, having a bottom edge formed with a lug;

a pair of electrode terminals, each having a tail end bent with a contact portion, one electrode terminal having an upper end pivoted with a rotary member and an annular connecting member by a rivet;

the rotary member an elastic connecting member having a through hole for passage of the rivet, and formed with an insertion hole for insertion of the elastic connecting member;

the annular connecting member made of a conducting metal, and having a through hole for passage of the rivet, the annular connecting member formed with a ring portion defining a penetration hole for passage of the rotation shaft, the penetration hole formed with a locking portion for locking the elastic connecting member, so that the annular connecting member may be rotated by the elastic connecting member, the ring portion provided with two contact guide portions corresponding to the positions of the contact portions of the two electrodes terminals;

the elastic connecting member having a first end inserted into the insertion hole of the rotary member, and a second end locked in the locking portion of the annular connecting member;

an insulating plate having a periphery formed with combination recesses, and a center defining a hole, the insulating plate having a front end riveted with the two electrode terminals, and a rear end defining a slide slot for limiting displacement of the elastic connecting member that protrudes from the locking portion of the annular connecting member;

a switch portion seat having a periphery formed with multiple combination pins, a center formed with a receiving hole, and having a front side formed with an opening for receiving each part of the switch portion;

wherein, the control plate is rotated by the rotation shaft, and the lug of the control plate is rested on the rotary member, so that the rotary member is rotated about the rivet, while the annular connecting member is rotated when the rotary member is rotated, so that the two contact guide portions of the annular connecting member is rotated to contact and conduct one of the two contact portions of the electrodes terminals on the insulating plate 53, thereby forming an opened or closed status.

2. The switch type variable resistor in accordance with claim 1, wherein the variable resistor portion in a dual connection includes a pair of terminal seats each having variable resistor carbon film plates and terminals, a pair of contact plates, and a contact plate seat, each contact plate is rotated by the rotation shaft to contact the variable resistor carbon film plates of the terminal seat at different locations, thereby changing the resistance values, the contact plate seat consists of an upper seat and a lower seat, the upper seat has a periphery formed with adjusting teeth, while the housing is formed with adjusting windows corresponding to the positions of the adjusting teeth, thereby adjusting mutual deflection of the contact plates of the upper and lower seats and the variable resistor carbon film plates.

* * * * *